United States Patent
Froidevaux et al.

(10) Patent No.: US 10,217,717 B2
(45) Date of Patent: Feb. 26, 2019

(54) DISTRIBUTION OF ELECTRONIC CIRCUIT POWER SUPPLY POTENTIALS

(71) Applicant: STMicroelectronics (Rousset) SAS, Rousset (FR)

(72) Inventors: Nicolas Froidevaux, Aix en Provence (FR); Yann Bacher, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 50 days.

(21) Appl. No.: 15/137,144

(22) Filed: Apr. 25, 2016

(65) Prior Publication Data
US 2017/0141069 A1    May 18, 2017

(30) Foreign Application Priority Data
Nov. 18, 2015    (FR) ...................... 15 61095

(51) Int. Cl.
*H01L 23/00* (2006.01)
*H01L 23/50* (2006.01)
(Continued)

(52) U.S. Cl.
CPC .......... *H01L 24/49* (2013.01); *H01L 23/3107* (2013.01); *H01L 23/50* (2013.01);
(Continued)

(58) Field of Classification Search
CPC ......... H01L 24/25; H01L 24/82; H01L 24/24; H01L 24/49; H01L 2224/13014; H01L 2224/0133; H01L 2224/3185; H01L 2224/13147; H01L 2224/11462; H01L 2224/13083; H01L 2224/13026; H01L 2224/11019; H01L 2224/13551; H01L 2224/13155; H01L 2224/13017; H01L 24/13; H01L 24/11
See application file for complete search history.

(56) References Cited

U.S. PATENT DOCUMENTS 5,838,072 A * 11/1998 Li ........................... H01L 23/50
                                                                257/786
6,770,963 B1    8/2004 Wu
(Continued)

FOREIGN PATENT DOCUMENTS

EP    0887800 A2    12/1998
TW    200910482 A    3/2009

OTHER PUBLICATIONS

INPI Search Report and Written Opinion for FR 1561095 dated Jul. 12, 2016 (11 pages).
(Continued)

*Primary Examiner* — Hoa (Vikki) B Trinh
(74) *Attorney, Agent, or Firm* — Crowe & Dunlevy

(57) ABSTRACT

An integrated circuit includes peripheral conductive pads interconnected by a peripheral conductive track within an integrated circuit chip. The integrated circuit chip further includes internal conductive pads interconnected by an internal conductive track within the integrated circuit chip. A conductive bonding wire external to the integrated circuit chip connects the one peripheral conductive pad to one internal conductive pad. A package encapsulates the integrated circuit chip and the conductive bonding wire.

8 Claims, 2 Drawing Sheets

(51) Int. Cl.
*H01L 23/528* (2006.01)
*H01L 23/31* (2006.01)

(52) U.S. Cl.
CPC .......... *H01L 23/5286* (2013.01); *H01L 24/45* (2013.01); *H01L 24/48* (2013.01); *H01L 2224/45144* (2013.01); *H01L 2224/45147* (2013.01); *H01L 2224/4813* (2013.01); *H01L 2224/48227* (2013.01); *H01L 2224/4912* (2013.01); *H01L 2924/14* (2013.01)

(56) References Cited

U.S. PATENT DOCUMENTS

| | | |
|---|---|---|
| 9,196,598 B1 | 11/2015 | Kumar et al. |
| 2006/0197234 A1 | 9/2006 | Pape |
| 2012/0216164 A1 | 8/2012 | Graf et al. |

OTHER PUBLICATIONS

Kumar Shailesh et al: "BGA Packaging Using Insulated Wire for Die Area Reduction," 2014 IEEE 16th Electronics Packaging Technology Conference (EPTC), IEEE, Dec. 3, 2014, pp. 46-47.
First Office Action and Search Report for co-pending CN Appl. No. 201610352065.1 dated Sep. 3, 2018 (6 pages) No English Translation Available.

* cited by examiner

DISTRIBUTION OF ELECTRONIC CIRCUIT POWER SUPPLY POTENTIALS

PRIORITY CLAIM

This application claims the priority benefit of French Application for Patent No. 1561095, filed on Nov. 18, 2015, the disclosure of which is hereby incorporated by reference.

TECHNICAL FIELD

The present disclosure generally relates to electronic circuits and, more particularly, to the distribution of potentials for powering an integrated circuit.

BACKGROUND

Integrated circuits are generally assembled in a package and are connected to other circuits and to power supply terminals. The distribution of the power supply potentials or of static signals in an integrated circuit from external connection terminals is a recurring problem.

Most often, terminals of connection of the package to another package or to an electronic board are distributed at the periphery of the package containing the semiconductor material chip. Connecting one of these pads to a terminal for providing a static potential is generally insufficient to preserve homogeneity of the potential within the chip. Indeed, the tracks conveying this static potential from the external terminal all the way to the elements using them have parasitic resistances which generate potential drops.

One thus generally has to use a plurality of regularly distributed terminals of the package, which are connected to different pads of the integrated circuit internal to the package. A sort of ring is thus created around the integrated circuit to distribute the static potentials, particularly the power supply potentials. The higher the number of terminals delivering the potential, the better the distribution, that is, the smaller the power supply voltage intervals between the different points (pads) of the integrated circuit. However, the higher the number of terminals, the greater the package bulk.

SUMMARY

It would be desirable to decrease the number of terminals of connection of a package to static potentials without adversely affecting the distribution of these potentials in a circuit integrated in the package.

An embodiment overcomes all or part of the disadvantages of usual packages and of the distribution of a same static potential.

An embodiment provides a solution more particularly adapted to integrated circuits equipped with peripheral power supply rails.

An embodiment provides a solution which is easy to implement.

Thus, an embodiment provides an integrated circuit comprising: at least two peripheral conductive pads interconnected by a peripheral conductive track; and at least one conductive wire connecting the two conductive pads.

According to an embodiment, the circuit comprises: a first number of first peripheral conductive pads, interconnected by at least one first peripheral track; a second number of second conductive pads arranged close to the center of the chip, interconnected by at least one second conductive track; and conductive wires connecting two by two a first pad and a second pad.

According to an embodiment, the first and second numbers are equal.

According to an embodiment, the first and second conductive tracks are in different conductive levels.

According to an embodiment, the circuit further comprises: a third number of first peripheral conductive pads, interconnected by at least one third peripheral track; a fourth number of second pads arranged close to the center of the chip, interconnected by at least one fourth conductive track; and conductive wires connecting two by two a third pad and a fourth pad.

According to an embodiment, the third and fourth numbers are equal.

According to an embodiment, the third and fourth conductive tracks are in different conductive levels.

According to an embodiment, the first, second, third, and fourth numbers are equal.

According to an embodiment, said wires are made of copper or of gold.

An embodiment also provides an electronic circuit comprising: an integrated circuit such as hereabove; and a package comprising a first terminal connected by a conductive wire to only one of the peripheral pads of the circuit.

According to an embodiment, a second terminal is connected by a conductive wire to only one of the third pads of the integrated circuit.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION

Figure 1:
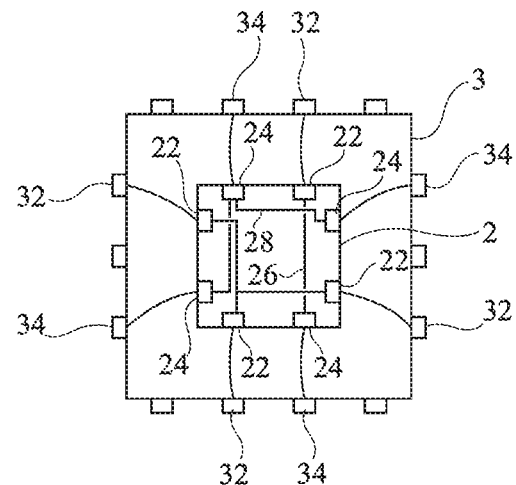
FIG. 1 schematically shows a usual embodiment of a connection of terminals of a package to pads of an integrated circuit contained in the package.

The same elements have been designated with the same reference numerals in the different drawings. In particular, the structural and/or functional elements common to the different embodiments may be designated with the same reference numerals and may have identical structural, dimensional, and material properties. For clarity, only those steps and elements which are useful to the understanding of the described embodiments have been shown and will be detailed. In particular, the destination of the static potentials, be it inside or outside of the circuit, has not been detailed, the described embodiments being compatible with current uses of such potentials. Further, the structures and functions of the integrated circuit have not been detailed either, the described embodiments being here again compatible with usual integrated circuit structures and functions. When reference is made to terms "about", "approximately", or "in the order of", this means to within 10%, preferably to within 5%. For simplification, only the connections of static power supply potentials will be described hereafter, since the other connections of signals processed by the integrated circuit are not modified by the implementation of the described embodiments.

FIG. 1 schematically shows an example of an integrated circuit in a package.

An integrated circuit chip 2 comprises a plurality of pads 22 and 24 distributed at the chip periphery and interconnected by peripheral rails 26 and 28. To homogeneously distribute the power supply potentials in rails 26 and 28, pads 22 and 24 are individually connected to terminals of connection of a package 3 which are, outside of the package, connected to the corresponding power supply potentials. Due to peripheral rails 26 and 28 at the level of chip 2, it is indeed usual to provide a plurality of external connections to limit the influence of the parasitic resistances of the rail conductors. However, this considerably increases the number of terminals 32 and 34 of package 3.

According to the embodiments which will be described, it is provided to distribute the power supply potentials (more generally, static potentials used in a plurality of areas of the integrated circuit) from the center of the integrated circuit chip.

Figure 2:
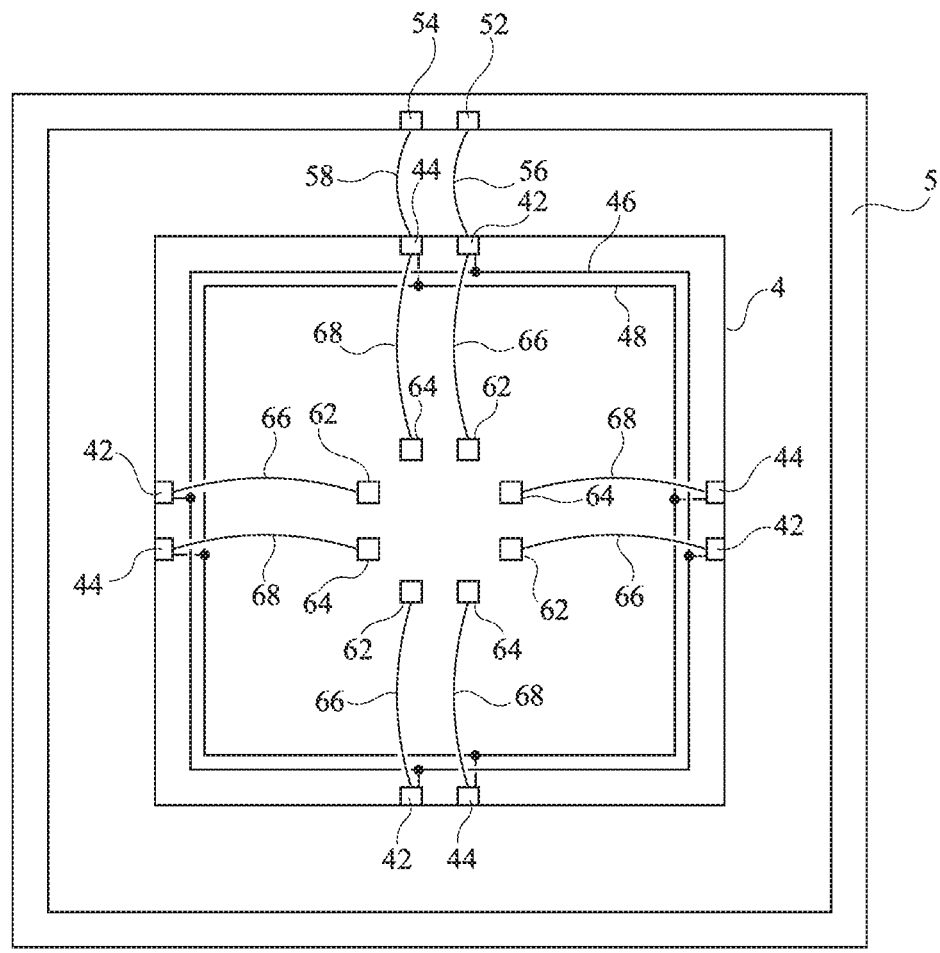
FIG. 2 schematically shows an embodiment of a connection of terminals of a package to pads of an integrated circuit contained in the package.

FIG. 2 is a simplified representation of an embodiment of a packaged integrated circuit.

An integrated circuit chip 4 is integrated in a package 5 comprising terminals 52 and 54 of connection to the outside. In the same way as for FIG. 1, for simplification, only the connections to power supply potentials are shown.

As compared with the FIG. 1 implementations, the package 5 comprises a single terminal 52 or 54 per power supply potential. Even if this does not appear from the drawings, which are not to scale, this enables either to decrease the package size, and thus the general bulk, or to make terminals of connection to the outside available to integrate other functions. To preserve homogeneous distribution of the power supply potentials, the chip still comprises a plurality of pads 42 and 44, preferably regularly distributed, connected to peripheral rails 46 and 48 of distribution of the power supply potentials.

It is provided to distribute the power supply potentials originating from terminals 52 and 54 from the center of chip 4 and no longer from the periphery thereof. As appears from the following description, differences in electric path length are thus decreased, which homogenizes the access resistances, and thus the distribution of the potentials at the level of chip 4.

In the shown example, at the center of chip 4, as many pads 62 and 64 (in the example, four pads 62 and four pads 64) as there exist pads 42 and 44 are provided. Pads 62 and 64 are, like pads 42 and 44, provided at the upper surface of the chip. Each pad 42, respectively 44, is connected by a wire 66, respectively 68, external to chip 4, to a pad 62, respectively 64. Thus, while there conventionally is a tendency to form all the connections with conductive tracks integrated to the chip, the inventors here provide forming the static potential connections from the outside of the chip.

Pads 52 and 54 are respectively connected, by conductive wires 56, respectively 58, to one (and only one) of pads 42, respectively 44, of the periphery of chip 4.

To allow the distribution of a plurality of static potentials and avoid wire crossings which would risk generating a short-circuit, pads 62 (or 64) are connected to one another, by nature of pads, by conductive tracks integrated to the chip. For example, the tracks are formed in the same metallization levels as peripheral tracks 46 and 48.

Figure 3:
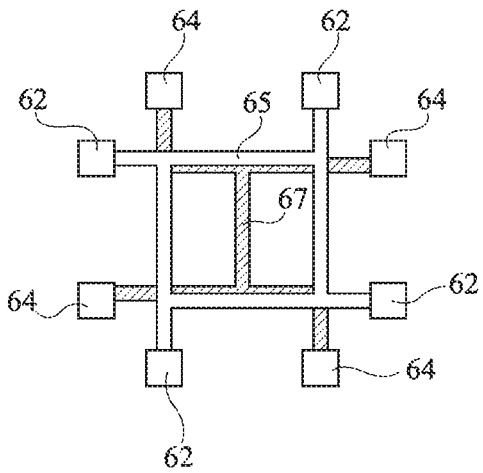
FIG. 3 schematically illustrates connections to the center of the integrated circuit in the embodiment of FIG. 2.

FIG. 3 is a simplified representation illustrating the forming of interconnections of pads 62 with one another and of pads 64 with one another. In this example, conductive tracks, respectively 65 and 67, connecting pads 62 together and, separately, pads 64 together, in two different conductive levels of chip 4, are provided.

The above-described embodiment takes advantage from the better conductivity of bonding wires, for example, made of gold or of copper, as compared with integrated conductive tracks. The distribution from the center of the chip further enables to homogenize the distributed potentials.

The larger the number of pads 42 and 44, and thus 62 and 64, of the chip, the better the power supply potential distribution.

Once the wire bondings have been performed, the assembly is encapsulated in an insulating resin forming the package. Conductive wires 56, 58, 66, and 68 are thus all integrated in package 5.

Figure 4:
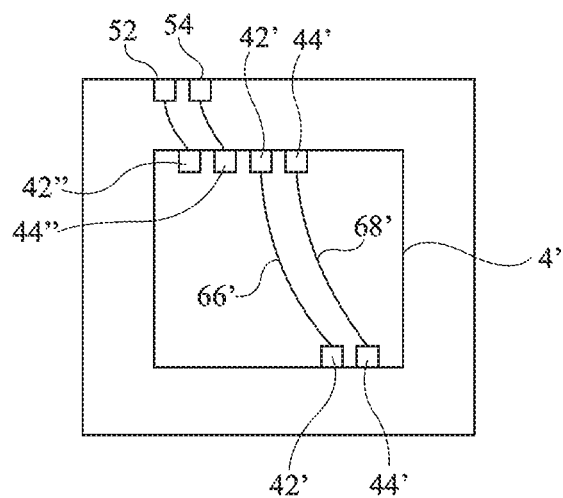
FIG. 4 schematically shows another embodiment of a connection of terminals of a package to pads of an integrated circuit contained in the package.

FIG. 4 is a top view of another embodiment enabling, without optimizing the distribution as in the embodiment of FIGS. 2 and 3, to however improve it with respect to current solutions.

In this example, the case of an integrated circuit 4' equipped with peripheral power supply potential distribution rails (not shown) in the same way as in FIG. 2 is considered. Circuit 4' comprises two approximately diametrically opposite peripheral pads 42' and two approximately diametrically opposite peripheral pads 44' (considering a circle within which the circuit is inscribed).

In the same way as in FIG. 2, two terminals 52 and 54 of the package are connected by wires to two peripheral pads 42" and 44" of the circuit. Pads 42" and 44" are connected by conductive tracks, not shown, to the peripheral power supply rails.

According to the embodiment of FIG. 4, conductive wires 66' and 68' connecting pads 42' and pads 44' two by two are provided. Thus, even with a single input point (pads 42" and 44") for the power supply potentials, the potential distribution is homogenized with respect to the simple peripheral rail while the number of terminals of the package is decreased.

Various embodiments have been described. Various alterations, modifications, and improvements will occur to those skilled in the art. In particular, the number of pads 42 and 44 may vary according to the applications. Further, the number of potentials to be distributed also varies according to the application. Further, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An integrated circuit, comprising:
   a first peripheral conductive pad located adjacent a first edge of an integrated circuit chip;
   a second peripheral conductive pad located adjacent a second edge of the integrated circuit chip, said second edge being opposite from the first edge;
   wherein the first and second peripheral conductive pads are interconnected by a first peripheral conductive track within the integrated circuit chip;
   a first conductive wire external to the integrated circuit chip, said first conductive wire having a first end in direct contact with the first peripheral conductive pad and having a second end in direct contact with the second peripheral conductive pad;

a package encapsulating the integrated circuit chip and said first conductive wire, wherein said package includes an external terminal; and a further conductive wire having a first end in direct contact with said external terminal and having a second end in direct contact with a third peripheral conductive pad, said third peripheral conductive pad being connected to the first peripheral conductive track; and said package further encapsulating the further conductive wire.

2. An integrated circuit, comprising:

a first peripheral conductive pad located adjacent a first edge of an integrated circuit chip;

a second peripheral conductive pad located adjacent a second edge of the integrated circuit chip, said second edge being opposite from the first edge;

wherein the first and second peripheral conductive pads are interconnected by a first peripheral conductive track within the integrated circuit chip;

a first internal conductive pad located at a center region of the integrated circuit chip;

a second internal conductive pad located at the center region of the integrated circuit chip;

wherein the first and second internal conductive pads are interconnected by a first internal conductive track within the integrated circuit chip;

a first conductive wire external to the integrated circuit chip, said first conductive wire having a first end in direct contact with the first peripheral conductive pad and a second end in direct contact with the first internal conductive pad; and a second conductive wire external to the integrated circuit chip, said second conductive wire having a first end in direct contact with the second peripheral conductive pad and a second end in direct contact with the second internal conductive pad.

3. The integrated circuit of claim 2, further comprising a package encapsulating the integrated circuit chip, said first conductive wire and said second conductive wire.

4. The integrated circuit of claim 3, wherein said package includes an external terminal and further comprising a further conductive wire having a first end in direct contact with said external terminal and having a second end in direct contact with the first peripheral conductive pad, said package further encapsulating the further conductive wire.

5. The integrated circuit of claim 2, wherein the first peripheral conductive track and the first internal conductive track are formed in different conductive levels of the integrated circuit chip.

6. The integrated circuit of claim 2, further comprising:

a third peripheral conductive pad located adjacent the first edge of the integrated circuit chip;

a fourth peripheral conductive pad located adjacent the second edge of the integrated circuit chip;

wherein the third and fourth peripheral conductive pads of the integrated circuit chip that are interconnected by a second peripheral conductive track within the integrated circuit chip;

a third internal conductive pad located at the center region of the integrated circuit chip;

a fourth internal conductive pad located at the center region of the integrated circuit chip;

wherein the third and fourth internal conductive pads are interconnected by a second internal conductive track within the integrated circuit chip;

a third conductive wire external to the integrated circuit chip, said third conductive wire having a first end in direct contact with the third peripheral conductive pad and a second end in direct contact with the third internal conductive pad; and a fourth conductive wire external to the integrated circuit chip, said fourth conductive wire having a first end in direct contact with the fourth peripheral conductive pad and a second end in direct contact with the fourth internal conductive pad.

7. The integrated circuit of claim 6, wherein the second peripheral conductive track and the second internal conductive track are formed in different conductive levels of the integrated circuit chip.

8. The integrated circuit of claim 1, wherein said first conductive wire is a bonding wire made of copper or gold.

* * * * *